(12) United States Patent
Thompson et al.

(10) Patent No.: US 6,221,537 B1
(45) Date of Patent: Apr. 24, 2001

(54) METHOD OF FORMING MASK WITH ANGLED STRUTS OF REDUCED HEIGHT

(75) Inventors: Matthew Allen Thompson, Round Rock, TX (US); Pawitter Jit Singh Mangat, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 08/994,389

(22) Filed: Dec. 19, 1997

(51) Int. Cl.[7] ....................................................... G03F 9/00
(52) U.S. Cl. ................................................. 430/5; 430/313
(58) Field of Search ........................................ 430/5, 313

(56) References Cited

U.S. PATENT DOCUMENTS

| | | | |
|---|---|---|---|
| 5,079,112 | * | 1/1992 | Berger et al. ............................ 430/4 |
| 5,318,687 | * | 6/1994 | Estes et al. ............................ 205/80 |
| 5,580,687 | * | 12/1996 | Leedy ........................................ 430/5 |
| 5,770,336 | * | 6/1998 | Choi .......................................... 430/5 |
| 5,781,607 | * | 7/1998 | Acosta et al. ........................... 378/34 |
| 5,846,676 | * | 12/1998 | Chiba et al. ............................... 430/5 |
| 5,866,281 | * | 2/1999 | Guckel et al. ........................... 430/22 |
| 5,899,728 | * | 5/1999 | Mangat et al. ......................... 438/459 |

* cited by examiner

*Primary Examiner*—Mark F. Huff
*Assistant Examiner*—Saleha R. Mohamedulla
(74) *Attorney, Agent, or Firm*—James L. Clingan, Jr.

(57) ABSTRACT

A method of forming a semiconductor device by obtaining a substrate, with a first surface and a second surface, where the substrate has a first material and a second material separated by an etch stop. A membrane film is deposited on the first surface of the substrate and the substrate is patterned to form an opening through the second surface and through the second material to the etch stop layer. The etch stop layer and the first material in the opening are then patterned to form the semiconductor device. This method may be used to form a lithographic mask and further embodiments of the present invention.

32 Claims, 3 Drawing Sheets

METHOD OF FORMING MASK WITH ANGLED STRUTS OF REDUCED HEIGHT

FIELD OF THE INVENTION

The present invention relates generally to semiconductor devices, and more particularly to a method of forming a semiconductor device used as a lithographic mask for patterning semiconductor devices.

BACKGROUND OF THE INVENTION

Lithography processes are used to transfer patterns from a mask to a semiconductor device. As feature sizes on semiconductor devices decrease into the submicron range, there is a need for new lithography processes to pattern high-density semiconductor devices. Projection electron-beam lithography is a well-known reduction technique for patterning semiconductor devices. In general, a projection electron-beam lithography system scans a beam across a mask to create an image on the semiconductor device. Electron optics can be inserted to provide a means of image reduction. One particular type of projection e-beam lithography is known as Scattering with Angular Limitation in Projection Electron-Beam Lithography developed by Lucent Technologies, Incorporated of Murray Hill, N.J. The basic principles of this technique are illustrated in prior art FIG. 1.

From prior art FIG. 1, a mask 10 having a patterned scattering layer 14 is provided on membrane 12, through which an electron beam is projected, as represented by the flux arrows 13. The patterned scattering layer produces more electron scattering than the membrane 12 as a result of the difference in atomic numbers between the composition of the patterned scattering layer 14 and the membrane 12, i.e., the patterned scattering layer 14 has a higher atomic number than that of the membrane 12. The scattering effect 16 of the electron beam through portions of the mask 10 is illustrated in FIG. 1. As shown, those portions of the electron beam that pass through the patterned scattering layer 14 tend to be scattered through larger angles, as depicted by the scattering effect 16, when compared with those less scattered portions 17 that pass between unpatterned portions of the scattering layer 14.

As shown, the electron beam that passes through the mask 10 is focused through an electron focusing system represented by lens 20. The electron beam then passes through back focal plane filter 30 having an aperture 18 that is provided to permit passage of those portions of the electron beam that were not scattered by the patterned scattering layer 14 of the mask 10 through some finite angle. The electron beam is then projected onto a semiconductor wafer 40 having a plurality of die 42 and a resist layer 44 spun on the semiconductor wafer 40 by conventional techniques. The electron beam forms a high contrast image including areas of low intensity formed by those scattered portions 16 of the electron beam that pass through patterned portions of the mask 10, and areas of relatively high intensity formed by those unscattered portions 17 of the electron beam that pass through the unpatterned areas of the mask 10. In this way, a high-resolution image may be projected onto the resist layer 44, which is then developed to form an exposed resist layer. The patterned resist layer 44 may be used as an etch mask for the underlying material. It is noted that the electron optics of the system may be adjusted so as to provide a reduction in image size, typically 4× or one-fourth the image size on the mask 10.

Prior art FIG. 2 is a cross-sectional view of the membrane film 12 and patterned scattering layer 14 (grouped in dashed line 25), shown in FIG. 1, oriented onto a mask 26. In prior art FIG. 2, a silicon substrate 27 with a membrane film 12 on top of the silicon substrate 27 has been patterned to form two different struts, struts 29 (shown by dashed lines) and struts 31. The two types of struts are formed depending on the choice of orientation of the single crystal silicon substrate and are not present at the same time but are shown together here for exemplary purposes. The problem with the strut 29 is that the angle 32 at which the strut 29 contacts the membrane film 12 is at about 54 degrees which results in increased coverage of the membrane film 12. This, in turn, leaves less unobstructed membrane film 12 on which the patterned scattering layer 14 must be located between the struts. Further, the problem with the strut 31 is that due to the horizontally long and narrow shape of the strut 31, such a strut has a high aspect ratio which results in an unstable support structure for the membrane film 12.

A need therefore exists for forming a strut that takes up less surface area of the membrane film 14 while also providing a stable support mechanism for that membrane film.

BRIEF DESCRIPTION OF THE DRAWINGS

A better understanding of the present invention can be obtained when the following detailed description of a preferred embodiment is considered in conjunction with the following drawings, in which.

Figure 1:
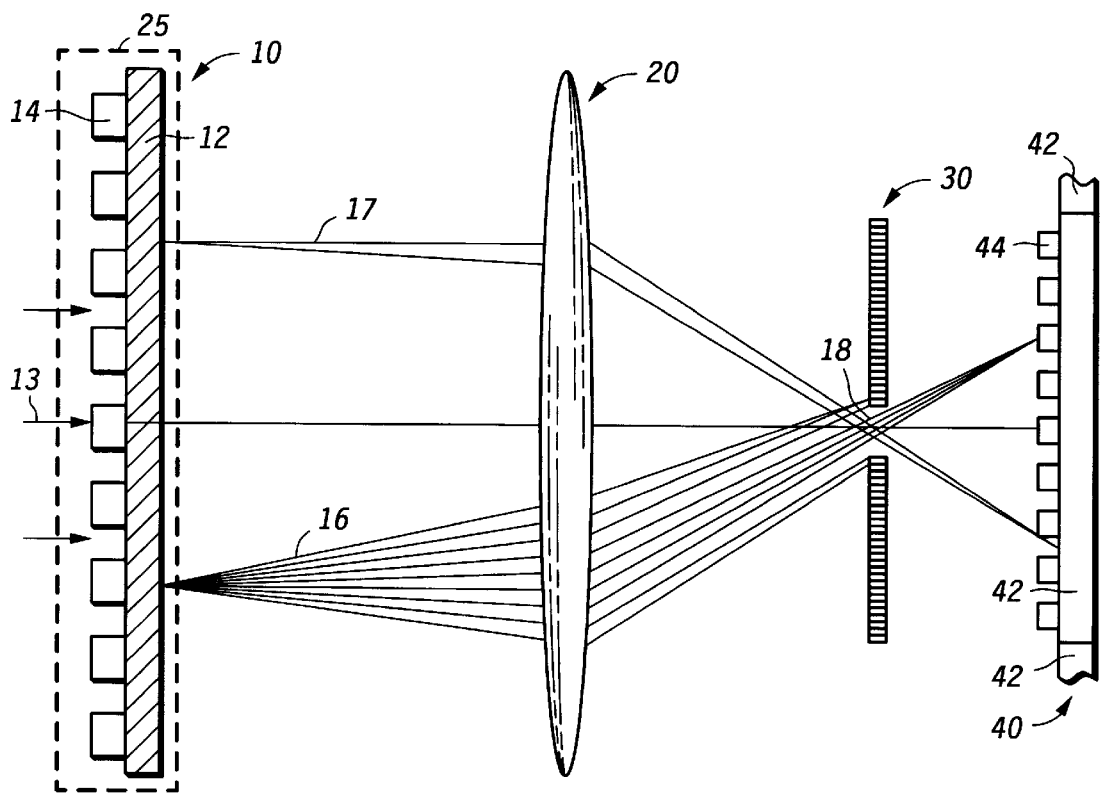
FIG. 1 is a prior art schematic view of the lithography technique known as scattering with angular limitation in projection electron-beam lithography.

It will be appreciated that for simplicity and clarity of illustration, elements illustrated in drawings have not necessarily been drawn to scale. For example, the dimensions of some of the elements are exaggerated relative to other elements for purposes of clarity. Further, where considered appropriate, reference numerals have been repeated among the drawings to represent corresponding or analogous elements.

DETAILED DESCRIPTION OF A PREFERRED EMBODIMENT

In the following detailed description, various embodiments of the method of forming a semiconductor device and a lithographic mask will be detailed. Further, various embodiments of a semiconductor device and a lithographic mask will also be described. It is understood, however, that the present invention is directed to a method of forming a semiconductor device by obtaining a substrate, with a first surface and a second surface, where the substrate has a first material and a second material separated by an etch stop. A membrane film is deposited on the first surface of the substrate and the substrate is patterned to form an opening through the second surface and through the second material to the etch stop layer. The etch stop layer and the first material in the opening are then patterned to form the semiconductor device. This method may be used to form a lithographic mask and further embodiments of the present invention. The method and device of the present invention will now be described in detail with reference to FIGS. 3–7.

Figure 3:
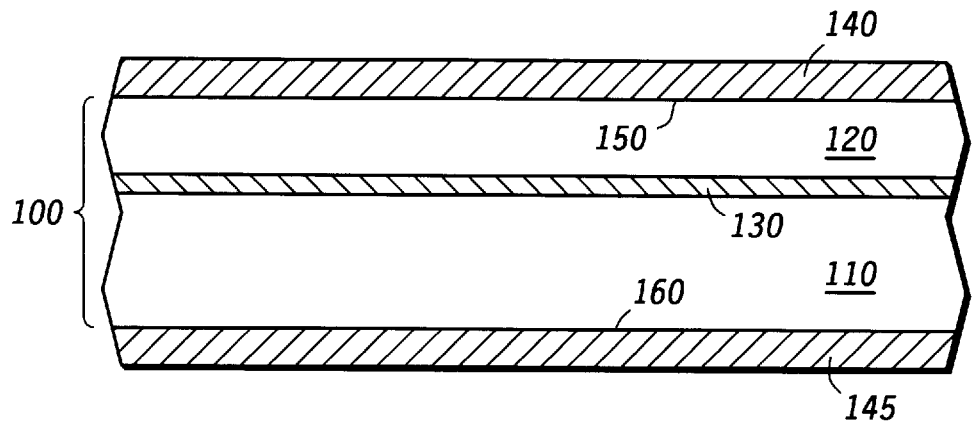
FIG. 3 depicts a cross-sectional view of a step used in an embodiment of the method of forming a semiconductor device of the present invention.

In FIG. 3, a cross-sectional view of a step used in forming an embodiment of the semiconductor device of the present invention is depicted. FIG. 3 has a substrate 100 that has a first material 120 and a second material 110 separated by an etch stop layer 130. The substrate 100 may be a silicon on insulator, but may also be formed using bonding techniques between two silicon substrates and an etch resistant layer such as an insulator as discussed below. The first material 120 and second material 110 may be composed of either <100> silicon or <110> silicon. The terms <100> silicon and <110> silicon refers to the crystallographic orientation of the single crystal silicon used to form the first and second materials as is commonly known in the art. The second material 110 has a thickness in the range of about 300 to 1000 microns while the first material 120 has a thickness in the range of 25 to 300 microns. The etch stop layer 130 has a thickness in the range of 100 to 2,000 angstroms. The etch stop layer 130 is typically silicon nitride but may also be silicon carbide or diamond-like carbon. After obtaining the substrate 100, a membrane film 140 is deposited on the first surface 150 of the substrate 100. As shown in FIG. 3, the membrane film 140 has also been deposited as an etch mask 145 on the second surface 160 of the substrate 100. The membrane film 140 is typically a silicon nitride however it may also be, for example, silicon carbide, diamond-like carbon or doped silicon. The thickness of the membrane film 140 is in the range of about 500 to 2000 angstroms.

Figure 2:
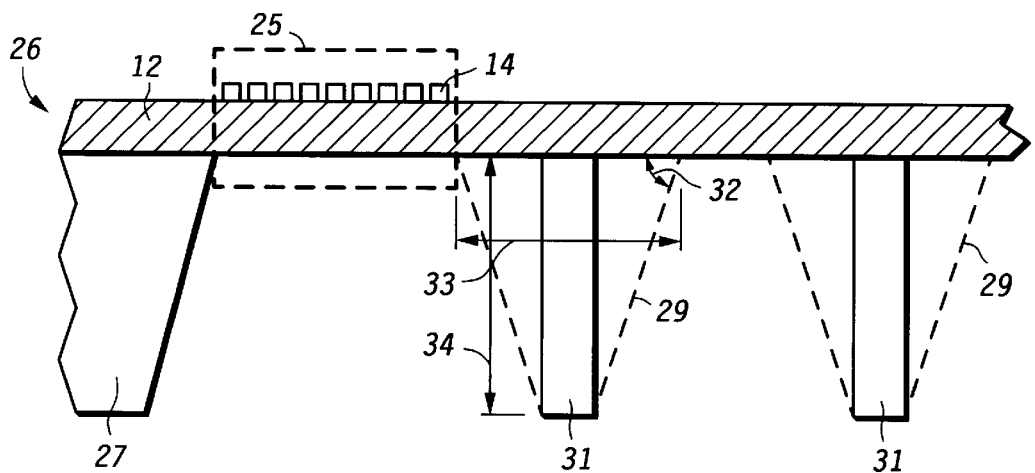
FIG. 2 is a prior art cross-sectional view of a prior art lithography mask.
Figure 4:
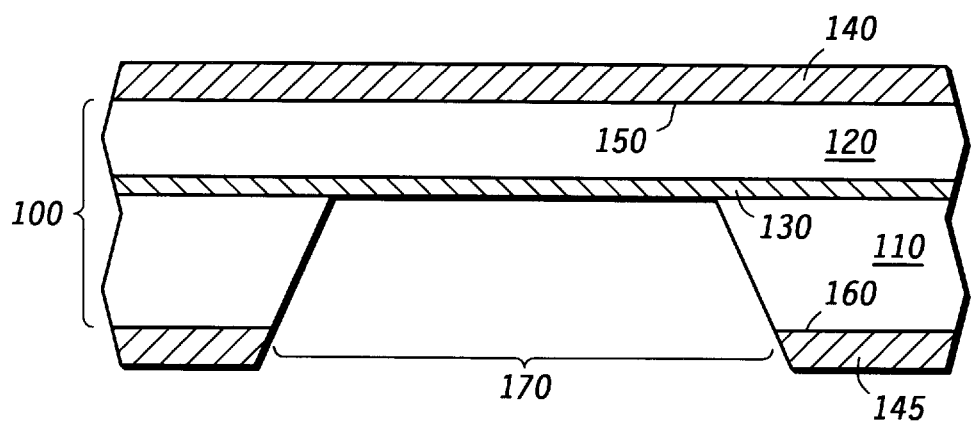
FIG. 4 depicts a cross-sectional view of a further step used in an embodiment of the method of forming a semiconductor device of the present invention.
Figure 5:
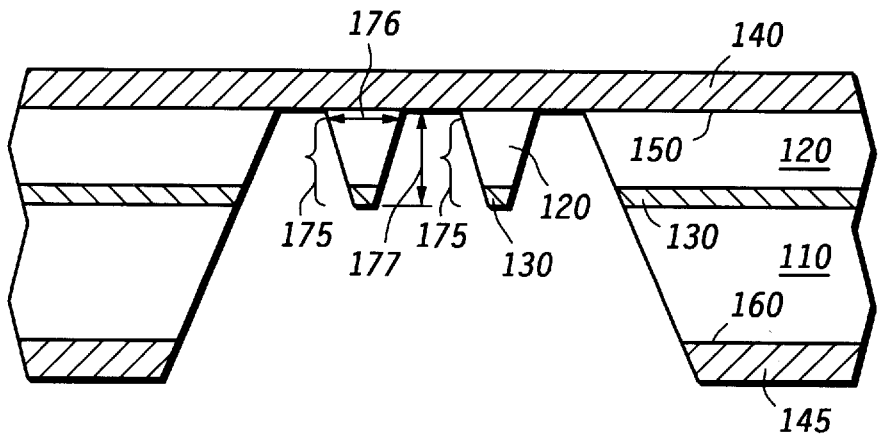
FIG. 5 depicts a cross-sectional view of a still further step of the method of forming an embodiment of the semiconductor device of the present invention.

FIG. 4 depicts a cross-sectional view of a further step in the method of forming the semiconductor device of the present invention. In FIG. 4, the substrate 100 has been patterned to form an opening 170 through the etch mask 145 and through the second material 110 up to the etch stop layer 130. FIG. 5 depicts a further cross-sectional view of still further steps performed on the semiconductor device of FIG. 4. In FIG. 5, the first material 120 and the etch stop layer 130 have been patterned up to the membrane film 140 to form the struts 175 and complete an embodiment of the semiconductor device of the present invention. The strut height 177 of the struts 175 may be controlled by the thickness of the second material 120 shown in FIGS. 3–5. It is important to note that the struts 175 of FIG. 5 have a similar angle to the angle described in prior art FIG. 2 of about 54 degrees, however the strut width 176 of the struts 175 of FIG. 5 have been reduced from about 1000 microns, as shown in the prior art strut width 33 in FIG. 2, to 160 microns for strut width 176 of the present invention. As such, additional surface area is provided on the membrane film 140 to more effectively use such space on the mask. Likewise, the strut height 177 of the strut 175 is typically in the range of about 25 microns to 300 microns while the prior art strut height 34 shown in FIG. 2 is typically 750 microns. It is therefore clear that the struts formed using the method of the present invention are both more stable, due to the consistent angle yet shorter height, and provide for an increased surface area on the membrane film to effectively use such space. It is also important to note that the struts may be formed from either the first or second materials of FIGS. 3–5, provided that the proper thickness of the materials is deposited.

Figure 6:
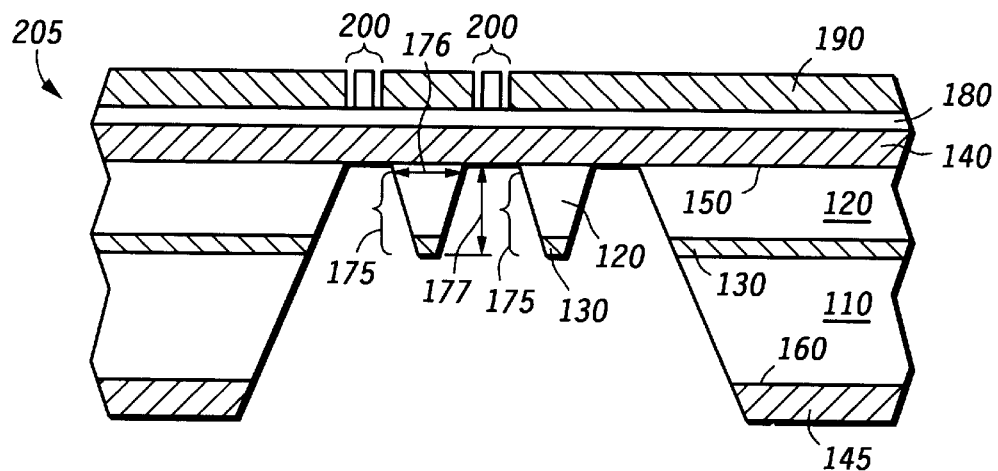
FIG. 6 depicts a cross-sectional view of steps used to form a lithographic mask of the present invention.

FIG. 6 is a cross-sectional view at a step in the method of forming a lithographic mask of the present invention. After the steps of forming the semiconductor device of FIG. 5 are completed, a scatterer etch stop layer 180 has been deposited on the membrane film 140. The scatterer etch stop layer is typically a chromium layer, however other materials that are selective to the etch process that are used to pattern the scatterer layer 190 may also be used. Such materials may include any conductive material, as for example, titanium. A typical thickness for the scatterer etch stop layer is about 50 angstroms. The scatterer etch stop layer 180 is used to prevent overetching into the membrane film 140 below the scatterer etch stop layer 180 during patterning of overlying layers. A scatterer layer 190 is deposited on the scatterer etch stop layer 180 and then patterned to form the mask 205 as shown by the patterned scatterer layer 200. The scatterer layer 190 provides a finished mask with a high scattering power due to the scatterer layer composition. The scatterer layer 190 may be a metal nitride, a metal-semiconductor nitride, a noble metal or a refractory metal. It is understood that all patterning steps used throughout this description include patterning using conventional techniques. The mask 205 may be used in any photolithography tool, and particularly the electron beam lithography tool depicted in FIG. 1.

Figure 7:
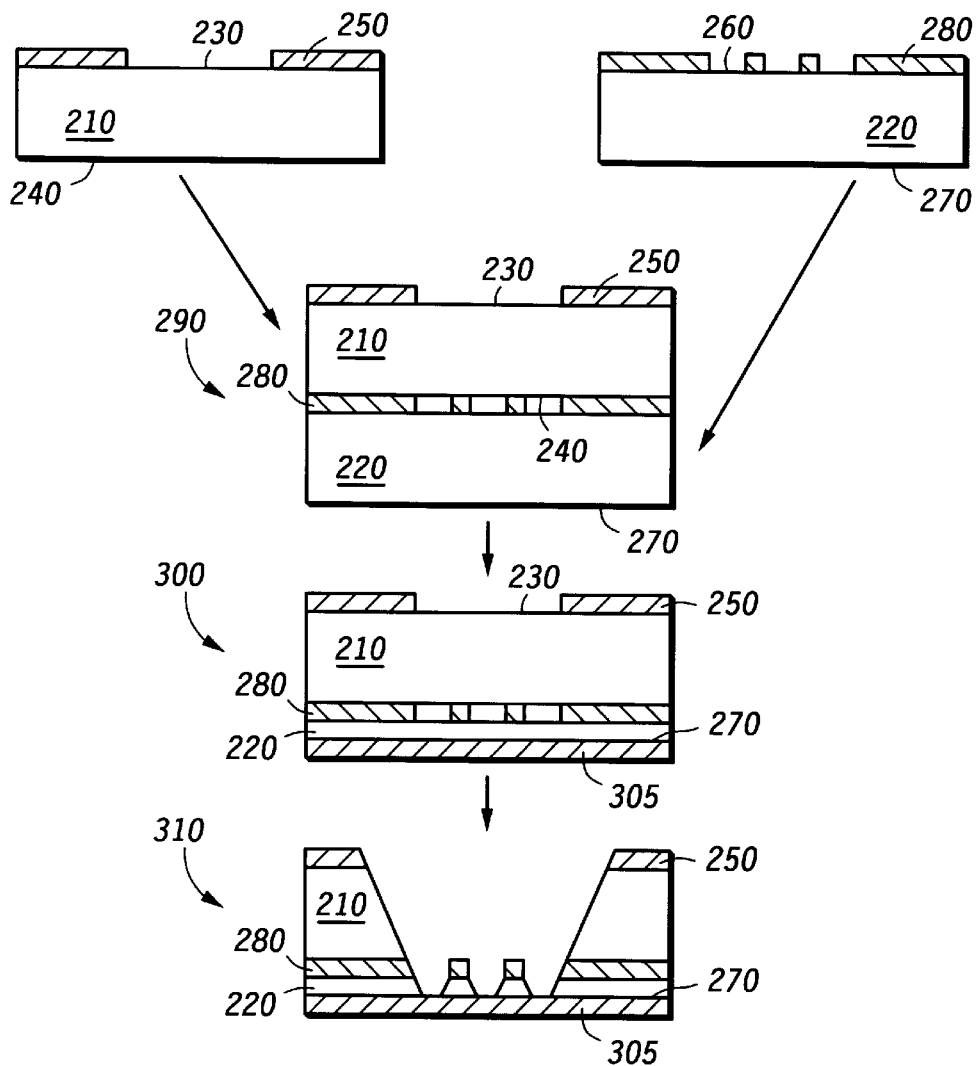
FIG. 7 are cross-sectional views of numerous steps used to create an alternative embodiment of the method of forming a semiconductor device of the present invention.

FIG. 7 depicts cross-sectional views of steps used in the method of forming a further embodiment of the semiconductor device of the present invention. In FIG. 7, a first substrate 210 having a first substrate first surface 230 and a first substrate second surface 240 is shown. The first substrate is typically single-crystalline silicon material. On the first substrate 210, a first patterned etch mask 250 has been formed over the first substrate first surface 230. The first pattern etch mask 250 is typically composed of the silicon nitride, however silicon carbide or diamond-like carbon may also be used. The first patterned etch mask 250 typically has a thickness in the range of about 500 to 2000 angstroms. A second substrate 220 has a second substrate first surface 260 and a second substrate second surface 270 with a second patterned etch mask 280 on the second substrate first surface 260. Again, the second substrate is typically a single-crystalline silicon material. At step 290, the first substrate second surface 240 is bonded to the second patterned etch mask 280. The technique for bonding the two substrates may be anodic bonding, fusion bonding, epoxy bonding, thermal compression bonding or other similar bonding techniques. At step 300, the second substrate second surface 270 has been polished to a second substrate predetermined thickness in the range of about 25 to 300 microns. Typical polishing techniques include chemical mechanical polishing or other chemical etching techniques. It is noted that in a further embodiment, the polishing step need not be performed if the second substrate is obtained at the proper second substrate predetermined thickness. Additionally, in still another embodiment, the polishing step may be performed before the bonding of the two substrates. Then, also in step 300, a membrane film 305 is deposited on the second substrate second surface 270. In step 310, the first and second substrates are patterned down to the membrane film 305 using the opening formed by the first patterned etch mask 250 and the opening formed by the second patterned etch mask 280 to form the semiconductor device.

It is understood that additional embodiments may be formed to fall within the scope of the present invention as claimed below so as to form struts that take up less surface area of a membrane film while also providing a stable support mechanism for that membrane film.

We claim:

1. A method of forming a mask for use in applying a pattern to a semiconductor die, comprising the steps of:
   obtaining a substrate, the substrate having a first material and a second material separated by an etch stop layer, the substrate having a first surface on the first material and a second surface on the second material;
   depositing a membrane film on the first surface of the substrate adjacent to the first material;
   patterning the substrate to form an opening through the second surface and through the second material to the etch stop layer and to leave a portion of the second material; and
   patterning the etch stop layer in the opening and the first material to the membrane film to form supporting struts, wherein are angled and of reduced height from that of the portion of the second material, of portions of the first material and the second material and to form an open area between the supporting struts; and
   forming a patterned scattering layer on the first surface, aligned with the open area, and according to the pattern to form the mask.

2. The method of claim 1 wherein the substrate is a silicon on insulator.

3. The method of claim 1 wherein the first material comprises <100> silicon and the second material comprises <100> silicon.

4. The method of claim 1 wherein the first material comprises <110> silicon and the second material comprises <110> silicon.

5. The method of claim 1 wherein the first material comprises <100> silicon and the second material comprises <110> silicon.

6. The method of claim 1 wherein the first material comprises <110> silicon and the second material comprises <100> silicon.

7. The method of claim 1 wherein the etch stop layer comprises silicon nitride, silicon carbide or diamond.

8. The method of claim 1 wherein the etch stop layer has a thickness in the range of about 100 to 2,000 angstroms.

9. The method of claim 1 wherein the second material has a thickness in the range of about 300 microns to 1,000 microns.

10. The method of claim 1 wherein the first material has a thickness in the range of about 25 microns to 300 microns.

11. The method of claim 1 wherein the membrane film comprises silicon nitride silicon carbide, diamond or doped silicon.

12. A method of forming a mask for use in applying a pattern to a semiconductor die, comprising the steps of
   obtaining a first substrate having a first substrate first surface and a first substrate second surface, the first substrate having a first patterned etch mask over the first substrate first surface;
   obtaining a second substrate having a second substrate first surface and a second substrate second surface, the second substrate having a second patterned etch mask over the second substrate first surface, wherein the second patterned etch mask is a mask for supporting struts having an open area therebetween;
   bonding the first substrate second surface to the second patterned etch mask to form a bonded substrate pair;
   polishing the second substrate second surface to a second substrate predetermined thickness for the second substrate and to an overall height of the bonded substrate pair;
   depositing a membrane film on the second substrate second surface after polishing the second substrate;
   patterning the first and second substrates to the membrane film using the first patterned etch mask and the second patterned etch mask to leave the supporting struts angled and lower than the overall height of the bonded substrate pair; and
   forming a patterned scattering layer on the membrane film, aligned with the open area, and according to the pattern to form the mask.

13. The method of claim 12 wherein the step of polishing is performed using chemical mechanical polishing techniques or other chemical etching techniques.

14. The method of claim 12 wherein the step of bonding is performed using anodic bonding or fusion bonding.

15. The method of claim 12 wherein the polishing step is performed before the bonding step.

16. The method of claim 12 wherein the second substrate predetermined thickness is in the range of about 25 to 300 microns.

17. A method of forming a lithographic mask comprising the steps of:
   obtaining a substrate, the substrate having a first material and a second material separated by an etch stop layer, the substrate having a first surface and a second surface;
   depositing a membrane film on the first surface of the substrate;
   patterning the substrate to form an opening through the second surface and through the second material to the etch stop layer and to leave a portion of the second material;
   patterning the etch stop layer in the opening and the first material to the membrane film to form struts, which are angled and of reduced height from that of the portion of the second material;
   depositing a scatterer etch stop layer on the membrane film;
   depositing a scatterer layer on the scatterer etch stop layer; and
   patterning the scatterer layer to form the mask.

18. The method of claim 17 wherein the scatterer etch stop layer comprises chromium, titanium or any conductive material.

19. The method of claim 17 wherein the scatterer layer includes a material selected from a group consisting of metal nitrides, a metal-semiconductor nitrides, noble metals and refractory metals.

20. The method of claim 17 wherein the mask is used in an electron beam lithography tool.

21. The method of claim 17 wherein the mask is used in a photolithography tool.

22. A mask for use in applying a pattern to a semiconductor die, comprising:
   a substrate, the substrate having a first material and a second material separated by an etch stop layer;
   a membrane film on a first surface of the substrate;
   an opening in the substrate being bordered by supporting struts, which are angled, comprised of the first material, and reduced in height from the second material, the opening being through the first and second materials to the membrane film; and
   a patterned scattering layer on a surface of the membrane film opposite to that of the struts, aligned with the opening of the substrate, and according to the pattern, wherein the supporting struts have a height greater than the features.

23. The mask of claim 22 wherein the substrate is a silicon on insulator.

24. The mask of claim 22 wherein the first material comprises <100> silicon and the second material comprises <100> silicon.

25. The mask of claim 22 wherein the first material comprises <110> silicon and the second material comprises <110> silicon.

26. The mask of claim 22 wherein the first material comprises <100> silicon and the second material comprises <110> silicon.

27. The mask of claim 22 wherein the first material comprises <110> silicon and the second material comprises <100> silicon.

28. The mask of claim 22 wherein the etch stop layer comprises silicon nitride, silicon carbide or diamond carbon.

29. The mask of claim 22 wherein the etch stop layer has a thickness in the range of about 100 to 2,000 angstroms.

30. The mask of claim 22 wherein the second material has a thickness in the range of about 300 microns to 1,000 microns.

31. The mask of claim 22 wherein the first material has a thickness in the range of about 25 microns to 300 microns.

32. The mask of claim 22 wherein the membrane film comprises silicon nitride, silicon carbide, diamond or doped silicon.

* * * * *